United States Patent
Kang et al.

(10) Patent No.: US 6,182,260 B1
(45) Date of Patent: Jan. 30, 2001

(54) CHANNEL ENCODING APPARATUS USING SINGLE CONCATENATED ENCODER

(75) Inventors: Bub Joo Kang; Chae Min Park; Jae Ryong Shim; Eung Bae Kim; Hyun Seo Oh, all of Daejeon (KR)

(73) Assignee: Electronics and Telecommunications Research Institute, Daejeon (KR)

( * ) Notice: Under 35 U.S.C. 154(b), the term of this patent shall be extended for 0 days.

(21) Appl. No.: 09/094,605

(22) Filed: Jun. 15, 1998

(30) Foreign Application Priority Data

Jun. 16, 1997 (KR) .................................. 97-24951

(51) Int. Cl.[7] .................................................. H03M 13/29
(52) U.S. Cl. ............................................................ 714/755
(58) Field of Search ................................ 714/755, 761, 714/774

(56) References Cited

U.S. PATENT DOCUMENTS

| | | | |
|---|---|---|---|
| 5,504,773 | * 4/1996 | Padovani et al. | 375/200 |
| 5,511,096 | * 4/1996 | Huang et al. | 375/265 |
| 5,537,410 | * 7/1996 | Li | 370/84 |
| 5,859,843 | * 1/1999 | Honkasalo et al. | 370/342 |
| 5,867,490 | * 2/1999 | Campanella | 370/326 |
| 5,881,093 | * 3/1999 | Wang et al. | 275/200 |
| 5,923,711 | * 7/1999 | Wilming | 375/287 |
| 5,946,357 | * 8/1999 | Sandin et al. | 375/296 |
| 5,949,790 | * 9/1999 | Pekhonen et al. | 370/465 |
| 5,983,383 | * 11/1999 | Wolf | 714/755 |
| 6,005,855 | * 12/1999 | Zehavi et al. | 370/355 |
| 6,034,996 | * 3/2000 | Herzberg | 375/265 |

\* cited by examiner

*Primary Examiner*—Stephen M. Baker
(74) *Attorney, Agent, or Firm*—Jacobson, Price, Holman & Stern, PLLC

(57) ABSTRACT

Generally, Reed-Solomon encoding process in the conventional communication system is executed by a Reed-Solomon encoder having different code rates for different data transmission rates. The present invention does not use a Reed-Solomon encoder having different coding rates, but instead uses a Reed-Solomon encoder having the same code rate regardless of data transmission rate. Accordingly, the present invention has the following effects. The present invention maintains same communication quality regarding data services having each different data transmission rate, and can use a single Reed-Solomon encoder.

8 Claims, 3 Drawing Sheets

[FIG. 1]
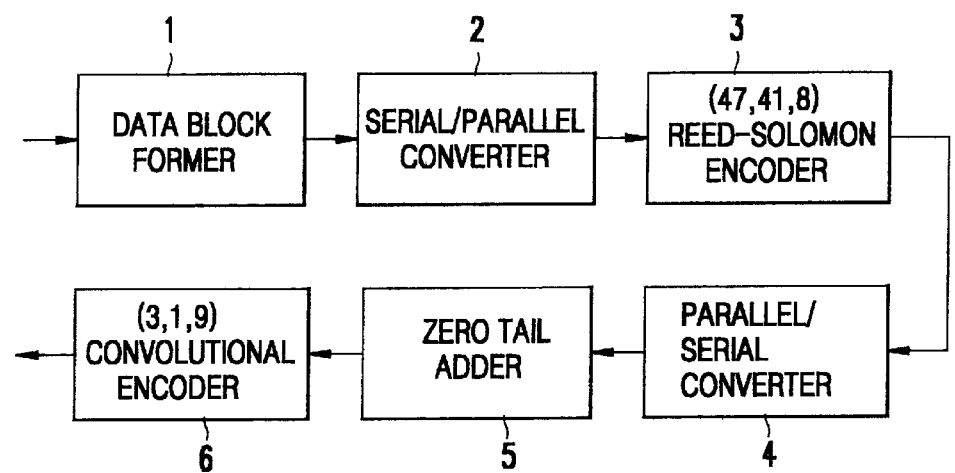
[FIG. 2]
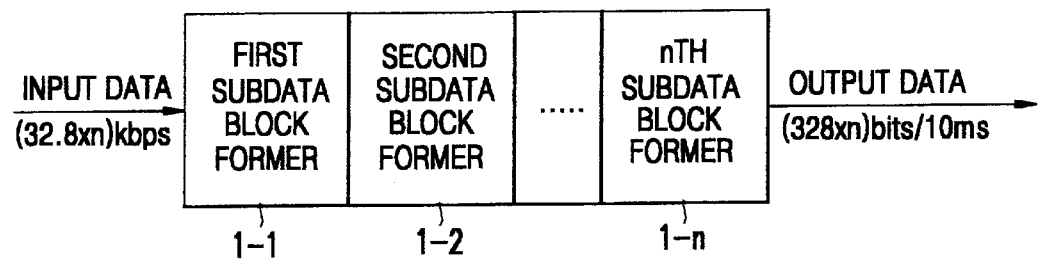

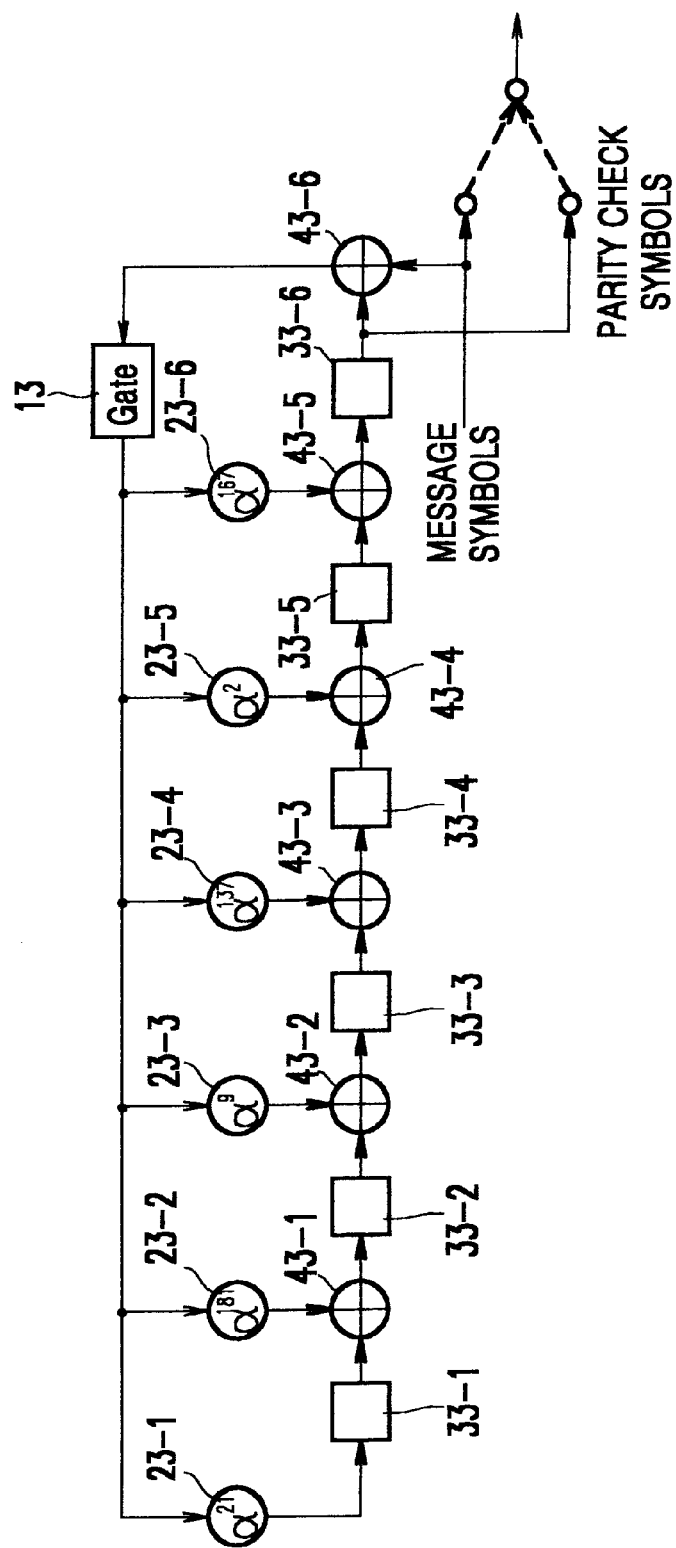
[FIG. 3]

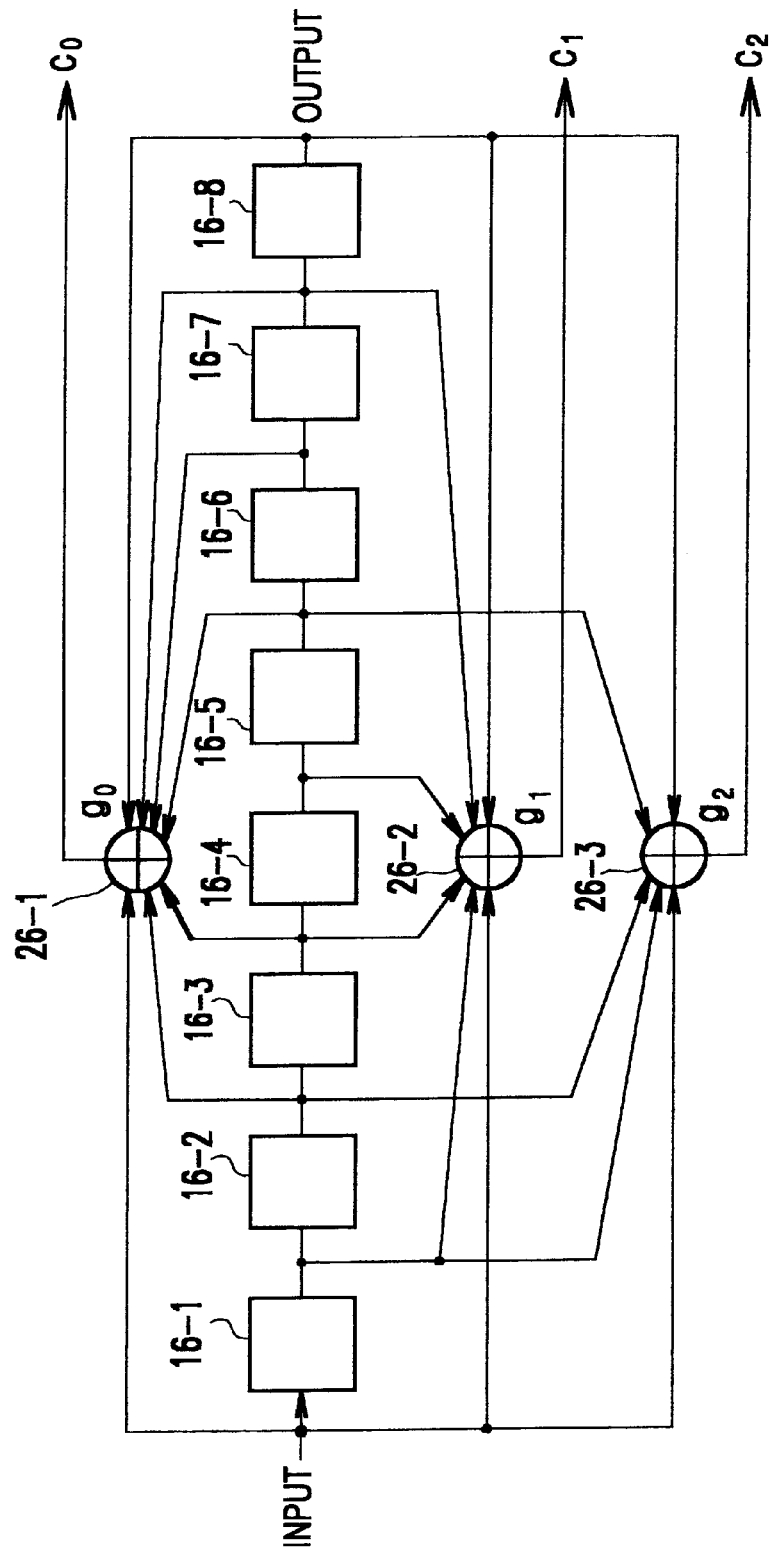
[FIG. 4]

CHANNEL ENCODING APPARATUS USING SINGLE CONCATENATED ENCODER

BACKGROUND OF THE INVENTION

1. Field of the Invention

The present invention relates to a channel encoding apparatus, and in particular to an improved channel encoding apparatus using a single concatenated encoder, which forms several subdata blocks having high data transmission rates, and encodes variable transmission rate data having high data transmission rates using a single concatenated encoder.

2. Description of the Related Art

In the field of conventional mobile communication, it further provides voice services than data services to users. Accordingly, a convolutional encoder is only used in the conventional mobile communication instead of a concatenated encoder with low encoding rate.

In the case that the systems which provide multimedia services such as an IMT2000 use only a convolutional encoder, they need high signal-to-noise ratio to maintain communication quality. As a result, the communication capacity in DS/CDMA system is reduced.

Also, in the case that the data transmission rate is variable and increased, since the system is additionally composed of a concatenated encoder, the system is complicated and the hardware of base station and terminal is complicated.

SUMMARY OF THE INVENTION

Accordingly, it is an object of the present invention to provide a channel encoding apparatus using a concatenated encoder, which overcomes the problem of additional complexity of an RS encoder due to variation of data transmission rates.

It is another object of the present invention to provide an improved channel encoding apparatus using a concatenated encoder which uniformly maintains communication quality in data services with each different data transmission rate.

It is another object of the present invention to provide improved channel encoding apparatus using a concatenated encoder which uses a single concatenated encoder to maintain communication quality, in the case that the concatenated encoder is used according to the kinds of data services in the system, which provide data services at several data transmission rates, such as IMT2000, or services having variable data transmission rates such as wireless multimedia services.

To achieve the above objects, there is provided an improved channel encoding apparatus using a single concatenated encoder which includes a data block former for forming subdata blocks according to input data bits per frame for each data transmission rate; a serial/parallel converter for converting information bits contained within the each subdata blocks formed by the data block former into several message symbols as a unit of 8 bits; a Reed-Solomon encoder for outputting the message symbols converted by the serial/parallel converter 2, and generating several parity check symbols according to the message symbols to generate a Reed-Solomon code symbols; a parallel/serial converter for converting the Reed-Solomon code symbols generated by the Reed-Solomon encoder into serial data bit; a zero tail adder for adding eight zero tail bits to the serial data bit converted by a parallel/serial converter; and a convolutional encoder for convolutionally encoding the output data bits and the 8 zero tail bits.

BRIEF DESCRIPTION OF THE DRAWINGS

The present invention will become more fully understood by the detailed description given hereinbelow and the accompanying drawings which are given by way of illustration only, and thus are not limitative of the present invention, and wherein:

FIG. 1 is a block diagram of a channel encoding apparatus according to the present invention;

FIG. 2 is a detailed block diagram of a data block former in FIG. 1;

FIG. 3 is a detailed block diagram of a Reed-Solomon encoder in FIG. 1; and

FIG. 4 is a detailed block diagram of a convolutional encoder in FIG. 1.

DETAILED DESCRIPTION OF THE INVENTION

Hereinafter, the present invention will now be described by referring to the attached drawings.

FIG. 1 is a block diagram of a channel encoding apparatus using a concatenated encoder according to the present invention.

As shown in FIG. 1, the channel encoding apparatus using a concatenated encoder includes a data block former 1 for forming sub-data blocks according to frames of input data bits for each data transmission rate, a serial/parallel converter 2 for converting the sub-data blocks formed by the data block former 1 into several message symbols, a Reed-Solomon encoder 3 for outputting the message symbols converted by the serial/parallel converter 2, and generating several parity check symbols according to the message symbols to generate a Reed-Solomon code symbols, a parallel/serial converter 4 for converting the Reed-Solomon code symbols into serial data bits, and a zero tail adder 5 for adding eight zero tail bits for Viterbi decoding to the serial data bits converted by parallel/serial converter 4, and a convolutional encoder 6 for convolutional encoding the output data bits from the adder.

As shown in FIG. 2, the data block former 1 includes a plurality of subdata block formers (1-1~1-n).

As shown in FIG. 3, the Reed-Solomon encoder 3 includes a gate 13 for transmitting message symbols outputted from the serial/parallel converter 2, a plurality of multipliers (23-1~23-6) for multiplying message symbols transmitted from the gate 13 by predetermined coefficients, an 8-bit storage device 33-1 for storing 8 data bits outputted from the multiplier 23-1, an exclusive OR gate 43-1 for exclusive-ORing data stored in the 8-bit storage device 33-1 with 8 data bits outputted from the multiplier 23-2, an 8-bit storage device 33-2 for storing 8 data bits outputted from the exclusive OR gate 43-1, an exclusive OR gate 43-2 for exclusive-ORing 8 data bits stored in the 8-bit storage device 33-2 with data outputted from the multiplier 23-3, an 8-bit storage device 33-3 for storing 8 output data bits of the exclusive OR gate 43-2, an exclusive OR gate 43-3 for exclusive-ORing 8 data bits stored in 8-bit storage device 33-3 with 8 output data bits of the multiplier 23-4, an 8-bit storage device 33-4 for storing 8 output data bits of the exclusive OR gate 43-3, an exclusive OR gate 43-4 for exclusive-ORing data stored in the 8-bit storage device 33-4 with output data bits of the multiplier 23-5, an 8-bit storage device 33-5 for storing 8 output data bits of the exclusive OR gate 43-4, an exclusive OR gate 43-5 for exclusive-ORing 8 data bits stored in the 8-bit storage device 33-5 with 8 output data bits of the multiplier 23-6, an 8-bit storage device 33-6 for storing output data of the exclusive OR gate 43-5, and an exclusive OR gate 43-6 for exclusive-ORing data stored in the 8-bit storage device 33-6 to message symbols of the serial/parallel converter 2 to apply to the gate 13.

As shown in FIG. 4, the convolutional encoder 6 includes eight 1-bit shift registers (16-1~16-8) for successively storing output data bits of the zero tail adder 5, an exclusive OR gate 26-1 for exclusive-ORing output data bits of the zero tail adder 5 to output data bits of the eight 1-bit shift registers (16-2, 16-3, and 16-5~16-8) to output exclusive-ORed data bits as output data bits C0, an exclusive OR gate 26-2 for exclusive-ORing output data bits of the zero tail adder 5 to output data bits of the eight 1-bit shift registers (16-1, 16-3, 16-4, 16-7 and 16-8) to output exclusive-ORed data bits as output data bits C1, and an exclusive OR gate 26-3 for exclusive-ORing output data bits of the zero tail adder 5 to output data bits of the eight 1-bit shift registers (16-1, 16-2, 16-5 and 16-8) to output exclusive-ORed data bits as output data bits C2.

The operation of the above-mentioned channel encoding apparatus using a single concatenated encoder according to the present invention will now be illustrated.

First, when data with a data transmission rate of 32.8 kbps are inputted to a data block former 1, a first subdata block former 1-1 in the data block former 1 forms one frame of subdata block of 1 frame with 328 bits. The subdata block with 328 bits is converted into 8-bit message symbols by the 8 bits through a serial/parallel converter 2. Namely, the serial/parallel converter 2 converts a data block with 328 bits into 41 (328/8) message symbols for application on to a (47,41,8) Reed-Solomon encoder 3.

As shown in FIG. 3, the Reed Solomon encoder 3 outputs the 41 message symbols applied from the serial/parallel converter 2, and simultaneously applies 41 message symbols to gate 13 through an exclusive OR gate 43-6. At this time, since the gate 13 is conducting, the 41 message symbols are supplied to each multipliers (23-1~23-6).

After 41 message symbols are applied to each multipliers (23-1~23-6), the gate 13 is made non-conducting. The data stored in the 8-bit storage devices (33-1~33-6), namely 6 parity check symbols, are through the multipliers (23-1~23-6) and the exclusive OR gates (43-1~43-6). Accordingly, the Reed-Solomon encoder 3 generates 47 Reed-Solomon code symbols.

The 47 Reed-Solomon code symbols are converted into 376 (47×8) serial data bits through a parallel/serial converter 4.

Before the 376 bits of data are inputted to a (3,1,9) convolutional encoder 6, eight zero tail bits are added to the 376 data bits, for a Viterbi decoder of the receiver side (not shown). As a result, 384 bits data are inputted to the convolutional encoder 6. Illustrating the encoding process of the (3,1,9) convolutional encoder 5, referring to FIG. 4, all eight 1-bit shift registers (16-1~16-8) are reset at zero in an initial state. After 1 information bit is inputted to the convolutional encoder 5, 3 coded bits (C0,C1,C2) are outputted through the convolutional encoder 5. As a result, when 384 bits are inputted to the convolutional encoder 5, 1152 (384×3) coded bits are outputted by the convolutional encoder 5, and the convolutional encoding process is completed.

In this case, the encoding rate of the convolutional encoder 5 is ⅓, and the constraint length of the convolutional encoder 5 is 9.

In the case that the 1152 convolutional coded bits are divided into I/Q channels, the channel transmission rate is 57.6 kbps. In the case that the data transmission rate is 32.8 kbps, because the data block of 1 frame is 328 bits, the above-mentioned concatenated encoding can be realized.

But, in the case that the data transmission rate is over 32.8 kbps, namely, in case that data having the data transmission rate of 65.6 (32.8×2) kbps, 131.2 (32.8×4) kbps, or 524.8 (32.8×8) kbps is inputted to the data block former 1, the data block former 1 forms a data block with 656 bits, 1312 bits, or 5428 bits, respectively.

With reference to FIG. 2, a data block with 656 bits is divided into first and second subdata blocks (1-1,1-2), and then the first and second subdata blocks (1-1,1-2) are inputted to the (47,41,8) Reed-Solomon encoder 3. A data block with 1312 bits is divided into the first to fourth subdata blocks (1-1~1-4), and then the first to fourth subdata blocks (1-1~1-4) are inputted to the Reed-Solomon encoder 3. A data block with 5428 bits is divided into the first to sixth subdata blocks (1-1~1-16), and then the first to sixth subdata blocks (1-1~1-16) are inputted to the Reed-Solomon encoder 3.

Accordingly, in the case of the data block with 656 bits, the Reed-Solomon encoder 3 executes the Reed-Solomon encoding process twice, once to each of the first and second subdata blocks (1-1, 1-2). In the case of the data block with 1312 bits, the Reed-Solomon encoder 3 executes the Reed-Solomon encoding process four times, once to each of the first through fourth subdata blocks (1-1~1-4). In the case of the data block with 5428 bits, the Reed-Solomon encoder 3 executes the Reed-Solomon encoding process sixteen times, once to each of the first through sixteenth subdata blocks (1-1~1-16).

Regarding the encoded data at 65.6 kbps, a symbol interleaver (not shown) within the parallel/serial converter 4 executes a symbol-wise interleaving process on the first and second subdata blocks (1-1, 1-2) internally, and the parallel/serial converter 4 converts Reed-Solomon code symbols into serial bits. Regarding the encoded data at 131.2 kbps, the symbol interleaver executes a symbol-wise interleaving on the first to fourth subdata blocks, and the parallel/serial converter 4 converts Reed-Solomon code symbols into serial bits. Regarding the encoded data at 524.8 kbps, the symbol interleaver executes a symbol-wise interleaving on the first to sixteenth subdata blocks, and the parallel/serial converter 4 converts Reed-Solomon code symbols into serial bits.

After the symbol interleaving is executed according to data transmission rate, eight zero tail bits are added to each subdata block through an zero tail adder 5, and then the subdata blocks and added tail bits are inputted to the convolutional encoder 6.

In the case that encoding of a data block with 656 bits is generated in the convolutional encoding process, the output data of the convolutional encoder 6 are 2,304 (768×3) bits for a 10 ms frame, and then the output data with 2,304 bits are divided into I/Q channels. As a result, the channel transmission rate is at 230.4 kbps.

In the case that encoding of a data block with 1312 bits is generated in the convolutional encoding process, the output data of the convolutional encoder 6 are 4,608 (1,536×3) for a 10 ms frame, and then the output data with 4,608 bits are divided into I/Q channels. The channel transmission rate is at 230.4 kbps.

Lastly, in the case that encoding of a data block with 5,428 bits is produced by the convolutional encoding process, the output data of the convolutional encoder 6 are 18,432 (6,144×3) bits, and then the data with 18,432 bits are divided into I/Q channels. The channel transmission rate is at 921.6 kbps.

Generally, a Reed-Solomon encoding process in the conventional communication system is executed by a Reed-Solomon encoder generating each different code rate according to each data transmission rate. The present invention does not use a Reed-Solomon encoder generating each different code rate, but instead uses a Reed-Solomon encoder having the same code rate regardless of data transmission rate.

Accordingly, the present invention has the following effects. The present invention maintains the same communication quality for data services having different data transmission rates, and can use a single Reed-Solomon encoder.

Namely, when wireless multimedia services are applied in IMT2000, it is better to use the concatenated encoder rather than the convolutional encoder in achieving communication quality maintained at a low signal-to-noise ratio. Therefore, communication capacities can be increased.

In the systems having variable data transmission rate and having increased data transmission rate, in the case that a single concatenated encoder is used, another concatenated encoder is not needed. Therefore, the system according to the present invention has a simple composition, finally, the present invention can easily be included in the hardware of base stations and terminals.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A channel encoding apparatus using a concatenated encoder, comprising:
    a data block former for forming subdata blocks with constant size and grouped according to a plurality of different data transmission rates;
    a serial/parallel converter for converting the subdata blocks formed by the data block former into several message symbols;
    a Reed-Solomon encoder for outputting the message symbols converted by the serial/parallel converter, and computing several parity check symbols according to the message symbols to generate Reed-Solomon code symbols;
    a parallel/serial converter for converting the Reed-Solomon code symbols generated by the Reed-Solomon encoder into serial data bits;
    a zero tail adder for adding eight zero tail bits to the serial data bits from the parallel/serial converter; and
    a convolutional encoder for convolutionally encoding the output data bits from the zero tail adder.

2. The channel encoding apparatus of claim 1, wherein the data block former includes a plurality of subdata block formers to form subdata blocks with 328 bits, respectively.

3. The channel encoding apparatus of claim 1, wherein the serial/parallel converter outputs 41 message symbols.

4. The channel encoding apparatus of claim 1, wherein the Reed-Solomon encoder outputs 47 Reed-Solomon code symbols.

5. The channel encoding apparatus of claim 1, wherein the Reed-Solomon encoder comprises:
    a gate for transmitting message symbols outputted from the serial/parallel converter;
    first to sixth multipliers for multiplying message symbols transmitted from the gate by predetermined coefficients, respectively;
    a first 8-bit storage device for storing data outputted from the first multiplier;
    a first exclusive OR gate for exclusive-ORing data stored in the first 8-bit storage device to data outputted from the second multiplier;
    a second 8-bit storage device for storing data outputted from the first exclusive OR gate;
    a second exclusive OR gate for exclusive-ORing data stored in the second 8-bit storage device to data outputted from the third multiplier;
    a third 8-bit storage device for storing output data of the second exclusive OR gate;
    a third exclusive OR gate for exclusive-ORing data stored in the third 8-bit storage device to output data of the fourth multiplier;
    a fourth 8-bit storage device for storing output data of the third exclusive OR gate;
    a fourth exclusive OR gate for exclusive-ORing data stored in the fourth 8-bit storage device to output data of the fifth multiplier;
    a fifth 8-bit storage device for storing output data of the fourth exclusive OR gate;
    a fifth exclusive OR gate for exclusive-ORing data stored in the fifth 8-bit storage device to output data of the sixth multiplier;
    a sixth 8-bit storage device for storing output data of the fifth exclusive OR gate; and
    a sixth exclusive OR gate for exclusive-ORing data stored in the fifth 8-bit storage device to message symbols of the serial/parallel converter to apply to the gate.

6. The channel encoding apparatus of claim 1, wherein the parallel/serial converter comprises an external interleaver which executes an external interleaving among subdata blocks corresponding to a 10 ms frame before converting Reed-Solomon code symbols into serial bits for data transmission rates over 65.6 kbps.

7. The channel encoding apparatus of claim 1, wherein the convolutional encoder has an encoding rate of $\frac{1}{3}$ and a constraint length of 9.

8. The channel encoding apparatus of claim 1, wherein the convolutional encoder includes first to eighth 1-bit shift registers for successively storing output data of the zero tail adder;
    a first exclusive OR gate for exclusive-ORing output data bits of the zero tail adder to output data bits of the second, third and fifth to eighth 1-bit shift registers to output first exclusive-ORed data bits;
    a second exclusive OR gate for exclusive-ORing output data bits of the zero tail adder to output data bits of the first, third, fourth, and eighth 1-bit shift registers to output second exclusive-ORed data bits; and
    a third exclusive OR gate for exclusive-ORing output data bits of the zero tail adder to output data bits of the first, second, fifth and eighth 1-bit shift registers to output third exclusive-ORed data bits.

* * * * *